United States Patent
Beck et al.

(10) Patent No.: US 10,996,305 B2
(45) Date of Patent: May 4, 2021

(54) PROPELLER MR IMAGING WITH RELAXATION WEIGHTINGS VARYING BETWEEN K-SPACE BLADES AND K-SPACE DATA LINES

(71) Applicant: KONINKLIJKE PHILIPS N.V., Eindhoven (NL)

(72) Inventors: Gabriele Marianne Beck, Venlo (NL); Miha Fuderer, Eindhoven (NL); Johan Samuel Van Den Brink, Meteren (NL); Patrick Gross, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 66 days.

(21) Appl. No.: 16/462,571

(22) PCT Filed: Nov. 20, 2017

(86) PCT No.: PCT/EP2017/079745
§ 371 (c)(1),
(2) Date: May 21, 2019

(87) PCT Pub. No.: WO2018/095851
PCT Pub. Date: May 31, 2018

(65) Prior Publication Data
US 2020/0081086 A1    Mar. 12, 2020

(30) Foreign Application Priority Data

Nov. 24, 2016  (EP) ..................................... 16200465

(51) Int. Cl.
*G01R 33/561*    (2006.01)
*G01R 33/48*    (2006.01)
(Continued)

(52) U.S. Cl.
CPC ...... *G01R 33/5611* (2013.01); *G01R 33/4818* (2013.01); *G01R 33/50* (2013.01);
(Continued)

(58) Field of Classification Search
CPC ............ G01R 33/4818; G01R 33/4824; G01R 33/4828; G01R 33/50; G01R 33/5602;
(Continued)

(56) References Cited

U.S. PATENT DOCUMENTS

| 4,684,891 A | 8/1987 | Feinberg |
| 2013/0147478 A1 | 6/2013 | Zhou |

(Continued)

FOREIGN PATENT DOCUMENTS

| WO | 2012137606 A1 | 10/2012 | |
| WO | WO-2012137606 A1 * | 10/2012 | ......... G01R 33/4824 |

OTHER PUBLICATIONS

Pipe et al "Motion Correction With Propeller MRI . . . " Magnetic Resonance in Med. vol. 42, p. 963-969 (1999).
(Continued)

*Primary Examiner* — Jay Patidar

(57) ABSTRACT

A method of MR imaging of a body (10) of a patient reduces contrast blurring in PROPELLER imaging combined with multi-echo acquisitions. The method includes the steps of: generating MR signals by subjecting at least a portion of the body (10) to a MR imaging sequence including a number of RF pulses and switched magnetic field gradients;
acquiring the MR signals as a plurality of k-space blades (21-26) in temporal succession according to a PROPELLER scheme, each k-space blade (21-26) including a number of substantially parallel k-space lines, wherein the k-space blades (21-26) are rotated about the center of k-space, so that a total acquired data set of
(Continued)

MR signals spans at least part of a circle in k-space, wherein a common central circular region of k-space is covered by all k-space blades (21-26), wherein a relaxation weighting of the MR signals varies between different k-space blades (21-26);

estimating the relaxation weighting of the MR signals;

compensating the acquired MR signals according to the estimated relaxation weighting; and reconstructing a MR image from the compensated MR signals.

15 Claims, 2 Drawing Sheets

(51) Int. Cl.
  *G01R 33/50* (2006.01)
  *G06T 11/00* (2006.01)
(52) U.S. Cl.
  CPC ..... *G01R 33/5613* (2013.01); *G01R 33/5615* (2013.01); *G06T 11/006* (2013.01); *G06T 2210/41* (2013.01)
(58) Field of Classification Search
  CPC ............ G01R 33/5611; G01R 33/5613; G01R 33/5615; G06T 11/006; G06T 2210/41
  See application file for complete search history.

(56) References Cited

U.S. PATENT DOCUMENTS

| | | | |
|---|---|---|---|
| 2014/0043024 A1* | 2/2014 | Gui .................... | G01R 33/4824 324/309 |
| 2016/0274209 A1* | 9/2016 | Dannels ............. | G01R 33/4824 |

OTHER PUBLICATIONS

Huo et al "IDEAL with Turbo-Prop" ISMRM May 3-9, 2008 p. 650.

H.K. Song "K-Space Weighted Image Contrast (KWIC) for Contrast Manipulation in Project Resconstruction MRI" Magnetic Resonance in Medicine, vol. 44, No. 6 p. 825-8323 (2000).

Graff et al "An Algorithm for Lipid Water Separation in the Presence of T2 Decay" Proceedings of the International Society for Magnetic Resonance in Medicine, vol. 15, May 5, 2007 p. 1624.

Zhou et al "Mutli-Echo Propeller Imaging" Proceedings of the International Society for Magnetic Resonance in Medicine, Apr. 23, 2005 p. 291.

Pipe "Motion Corrected T1-Weighted Propeller FSE" proceedings of the International Society for Magnetic Resonance in Medicine, Apr. 23, 2005 p. 2236.

International Search Report dated Mar. 8, 2018.

* cited by examiner

PROPELLER MR IMAGING WITH RELAXATION WEIGHTINGS VARYING BETWEEN K-SPACE BLADES AND K-SPACE DATA LINES

CROSS REFERENCE TO RELATED APPLICATIONS

This application is a U.S. national phase application of International Application No. PCT/EP2017/079745 filed on Nov. 20, 2017, which claims the benefit of EP Application Serial No. 16200465.9 filed on Nov. 24, 2016 and is incorporated herein by reference.

FIELD OF THE INVENTION

The invention relates to the field of magnetic resonance (MR) imaging. It concerns a method of MR imaging of a body of a patient placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, time-varying magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

So-called PROPELLER imaging offers promising advantages for clinical MR imaging like robustness against patient motion and intrinsic motion compensation capabilities. In the PROPELLER concept (Periodically Rotated Overlapping ParalEL Lines, see James G. Pipe: "Motion Correction With PROPELLER MRI: Application to Head Motion and Free-Breathing Cardiac Imaging", Magnetic Resonance in Medicine, vol. 42, 1999, pages 963-969), MR signal data are acquired in k-space in N strips, each consisting of L parallel k-space lines, corresponding to the L lowest frequency phase-encoding lines in a Cartesian-based k-space sampling scheme. Each strip, which is also referred to as k-space blade, is rotated in k-space by an angle of, for example, 180°/N, so that the total MR data set spans a circle in k-space. If a full k-space data matrix having a diameter M is desired, then L and N may be chosen so that $L \times N = M \times \pi/2$. One essential characteristic of PROPELLER is that a central circular portion in k-space, having a diameter L, is acquired for each k-space blade. This central portion can be used to reconstruct a low-resolution MR image for each k-space blade. The low-resolution MR images can be compared to each other to remove in-plane displacements and phase errors, which are due to patient motion. The PROPELLER technique makes use of oversampling in the central portion of k-space in order to obtain an MR image acquisition technique that is robust with respect to motion of the examined patient during MR signal acquisition. Moreover, due to the (weighted) averaging of k-space blades PROPELLER 'averages out' further imaging artefacts resulting from, for example, $B_0$ inhomogeneities or inaccurate coil sensitivity maps when parallel imaging techniques like SENSE are used for MR data acquisition.

It is known that PROPELLER imaging is well-suited to be combined with multi-echo acquisitions, wherein a complete k-space blade is acquired after a single RF excitation. In TSE PROPELLER imaging, for example, the PROPELLER acquisition scheme is combined with a turbo spin echo (TSE) imaging sequence. One 'shot' of the TSE sequence comprises an initial RF pulse for excitation of magnetic resonance followed by a plurality of rapidly applied (typically 180°) refocusing RF pulses generating a train of differently phase-encoded spin echo signals. The echo signals are acquired, wherein each echo signal represents a k-space line, i.e. a one-dimensional sample of k-space, the position of the k-space line in the respective k-space blade being determined by the applied frequency encoding and phase encoding switched magnetic field gradients of the sequence. The so-called turbo factor (TF) is the number of echoes acquired after each excitation. In PROPELLER TSE imaging, a plurality of shots of the multi-echo sequence is applied for completely sampling k-space in order to be able to reconstruct a MR image from the acquired k-space profiles, wherein the k-space lines of each k-space blade are acquired after a single RF excitation respectively. Hence, the number of shots of the TSE sequence typically corresponds to the number of k-space blades acquired, and the turbo factor typically corresponds to the number of k-space lines per k-space blade.

Despite the benefits it is known that PROPELLER TSE introduces contrast blurring due to the size and rotation of the k-space blades and the PROPELLER-specific k-space distributed acquisition of echo signals experiencing different amounts of relaxation decay. Especially proton density (PD) and $T_1$ contrast introduce enhanced contrast blurring due to typically shorter TSE echo times and echo train lengths. Hence, PD and $T_1$ contrast weighted MR imaging is typically not used today in combination with PROPELLER TSE imaging.

The ISMRM-2008 (p. 650) abstract '*IDEAL with Turbo-PROP*' by D. Huo et al. concerns the use of multi-echo images form Turbo-PROP sequences. These images can be used to separate the water and fat signals based on the phase differences.

SUMMARY OF THE INVENTION

From the foregoing it is readily appreciated that there is a need for an improved MR imaging technique. It is consequently an object of the invention to provide a method that reduces contrast blurring in PROPELLER imaging combined with multi-echo acquisitions.

In accordance with the invention, a method of MR imaging of a body of a patient placed in the examination volume of a MR device is disclosed. The method comprises the steps of:
- generating MR signals by subjecting at least a portion of the body to a MR imaging sequence comprising a number of RF pulses and switched magnetic field gradients;
- acquiring the MR signals as a plurality of k-space blades in temporal succession according to a PROPELLER scheme, each k-space blade comprising a number of substantially parallel k-space lines, wherein the k-space blades are rotated about the center of k-space, so that the total acquired data set of MR signals spans at least part of a circle in k-space, wherein a common central circular region of k-space is covered by all k-space blades, wherein a relaxation weighting of the MR signals varies between different k-space blades;
- estimating the relaxation weighting of the MR signals;
- compensating the acquired MR signals according to the estimated relaxation weighting; and
- reconstructing a MR image from the compensated MR signals The invention suggests the acquisition of k-space blades according to the PROPELLER scheme, wherein the k-space lines of different k-space blades have different relaxation time contrasts. For example, the $T_1$-weighting and/or the $T_2$-weighting and/or the spectrally induced phase of the individual k-space lines may vary between the different k-space blades. In this way, a collection of MR signals having different contrasts is acquired (also) from the center of k-space during a single PROPELLER acquisition. It is an insight of the invention, that this enables the estimation of the relaxation decay and/or the spectrally induced phase of the MR signals during signal acquisition such that the MR signals can be compensated accordingly and thus a 'de-blurred' MR image can be obtained by image reconstruction from the compensated MR signals.

The method of the invention exploits the inherent substantial oversampling by PROPELLER scanning of the center of k-space which contains the crucial information regarding image contrast. Hence, the invention enables the reconstruction of an individual relaxation weighted and/or a spectrally weighted MR image for each relaxation applied during acquisition. For estimation of the relaxation weighting of the MR signals, a corresponding $T_1$-map and/or a $T_2$-map and/or a $B_0$ map and/or a water map and/or a fat map may be derived from the acquired MR-signals, wherein the acquired MR signals are compensated for variations according to the derived respective maps. Finally, a 'de-blurred' MR image can be reconstructed from the thus compensated MR signals.

The MR signal data attributed to a particular relaxation time will generally be undersampled, at least in the periphery of k-space. Hence, compressed sensing (CS) may advantageously be used for derivation of the respective $T_1$-map and/or $T_2$-map and/or $B_0$ map and/or water map and/or fat map from the undersampled MR signal data. The k-space lines of a particular relaxation time may even be distributed irregularly in k-space. The theory of CS is known to have a great potential for significant signal data reduction. In CS theory, a signal data set which has a sparse representation in a transform domain can be recovered from undersampled measurements by application of a suitable regularization algorithm. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction.

Moreover, pure PD and $T_2$ contrast-weighted MR images can be produced from a single PROPELLER acquisition according to the invention. Also an MR images with 'mixed' (PD, $T_1$, $T_2$) contrast can be synthesized from the MR signal data of a single PROPELLER acquisition. In addition, quantitative relaxation time and/or $B_0$-, water and/or a fat maps can be derived from the acquired data.

In a preferred embodiment, the relaxation time of the MR signals is varied by variation of echo times of the imaging sequence and/or by varying the delay (e.g. inversion) time after an (inversion recovery) pre-pulse. Hence, the k-space blades differ from each other by using different echo times to obtain different $T_2$-weightings, and/or—by using different inversion delays—to obtain different $T_1$-weightings.

In a further preferred embodiment, the imaging sequence may be a multi-echo imaging sequence, with a train of echo signals being generated by each shot, wherein each k-space line of each k-space blade represents an echo signal. The imaging sequence may be, for example, a turbo spin echo (TSE) sequence or a turbo field echo (TFE) sequence or an echo planar imaging (EPI) sequence. This enables the fast acquisition of a full k-space blade in a single shot of the imaging sequence. In this embodiment, the relaxation time may be varied according to the invention by variation of the acquisition order of the k-space lines from blade to blade. E.g., the $T_2$-weighting of a k-space line at a given position in a k-space blade depends on the position of the corresponding echo signal in the train of generated echo signals. The relaxation time weighting can thus be easily varied by changing the acquisition order of the k-space lines from blade to blade. Alternatively, the relaxation time may be varied by variation of the echo shifting of the individual echo signals.

To further optimize the k-space distribution of MR signals having different contrasts in the center of k-space during the acquisition of a number of PROPELLER blades according to the invention, the angular ordering of the blades may be chosen according to a Golden angle-scheme. In the Golden angle-scheme, the angle of the k-space lines is incremented each time by $\Delta\Phi=111.25°$ from blade to blade, which corresponds to 180° multiplied by the Golden ratio. Therefore, subsequently sampled spokes always add complementary information while filling the largest gaps within the previously sampled set of spokes. As a consequence, any sequential set of acquired spokes covers k-space approximately uniformly. Hereby, e.g., the initial three Golden angle blades are acquired using a first setting of the relaxation time, succeeded by three further Golden angle blades acquired using a different relaxation time. In addition, the echo order within each blade may be varied to further enforce the contrast distribution.

In a further preferred embodiment of the invention, the MR imaging sequence involves a flip angle sweep of the RF pulses, wherein the flip angle attributed to each acquired MR signal is considered in the estimation of the relaxation weighting. The $T_2$-weighting of a k-space line can be influenced by the flip angle sweep as typically used in TSE acquisitions. The information about the flip angle sweep needs to be incorporated, e.g. via a corresponding model, in the estimation of the relaxation time weighting. Furthermore, the flip angle sweep can be also adjusted to improve the precision of the estimation of the relaxation weighting. For example, in case the total number of k-space blades is small, the number of relaxation time weightings during a TSE shot can be flattened using the flip angle sweep.

As in conventional PROPELLER imaging, the method of the invention may also comprise the step of estimating and correcting motion-induced displacements and phase errors in the k-space blades. For example, low-resolution MR images reconstructed from the central k-space data of the k-space blades are compared to each other to remove in-plane displacements and phase errors, which are caused by patient motion. These factors should be corrected for in each k-space blade in accordance with the invention prior to further processing the MR signal data. This renders the method of the invention robust with respect to motion of the examined patient during MR signal acquisition. Since the variation of the relaxation time weighting also modifies the contrast of each low resolution MR image extra measures may be necessary for an exact determination and correction of patient motion. Similarity measure methods such as cross correlation and normalized mutual information may be used to align the obtained multi-contrast low resolution images.

According to a preferred embodiment of the invention, the imaging sequence is an echo planar imaging (EPI) sequence. The variation of the spectral weighting can be achieved by corresponding variation of the shifting of the EPI echo train between the individual k-space blades. Individual images at different echo times can be reconstructed therefrom, and a water map, fat map and a $B_0$ map can be reconstructed according to the known Dixon scheme. These can subsequently be used to provide distortion-free MR images by taking the $B_0$ map into account. MR images can be synthesized with a desired water/fat appearance.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
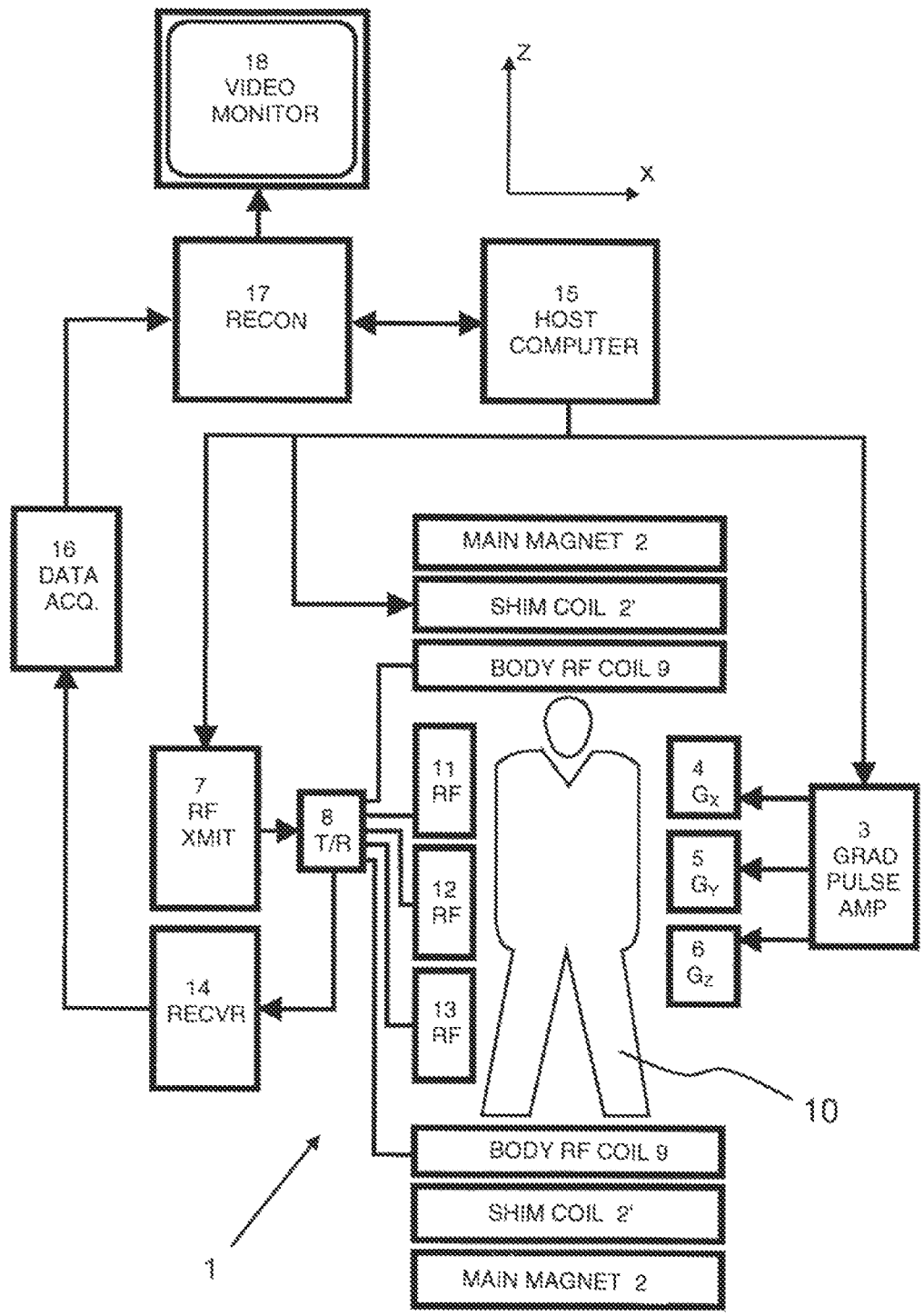
FIG. 1 shows a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 is programmed to execute the method of the invention described herein above and in the following.

Figure 2:
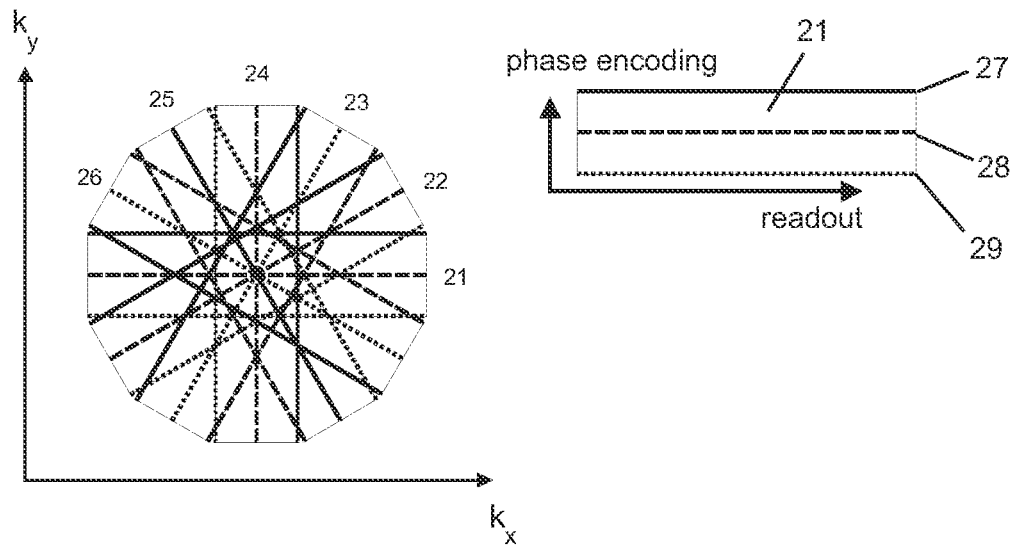
FIG. 2 schematically illustrates the PROPELLER acquisition scheme of the invention.

FIG. 2 illustrates the k-space sampling of PROPELLER MR imaging according to the invention. As shown in the left illustration of FIG. 2, six k-space blades 21-26 are acquired. Each blade 21-26 covers a different portion of k-space, wherein a central circular region of k-space is acquired for each blade 21-26. The blades 21-26 are rotated about the center of k-space, so that the total acquired MR data set spans a circle in k-space. In the right illustration of FIG. 2 a single k-space blade 21 is shown which is acquired using a single shot of a TSE sequence. The orientation of the phase encoding direction and the readout direction relative to the blade orientation is maintained for all rotation angles of the k-space blades 21-26. Motion-induced displacements and phase errors in the blades 21-26 are detected and corrected like in conventional PROPELLER imaging using known similarity measure methods. The different lines in blade 21 indicate the acquisition order of k-space lines 27, 28, 29. As an example, the solid line 27 corresponds to the first echo of a series of echo signals acquired after a single RF excitation. The dashed line 28 corresponds to the second echo, the dotted line 29 corresponds to the third echo. As can be seen in the left image of FIG. 2, the acquisition order of the echo signals is varied from blade to blade such that the relaxation time-weighting ($T_2$-weighting) of the MR signals varies between the different blades 21-26.

The invention suggests a different TSE contrast or TSE order per blade as indicated in FIG. 2. The variation of the TSE contrast can be achieved, e.g., by TSE echo shifting as it is commonly used in asymmetric TSE techniques. The different TSE order per blade enables contrast variations in the center of k-space during a single PROPELLER acquisition. This is illustrated in FIG. 2 by the different (solid, dashed, dotted) lines 27, 28, 29. Individually relaxation time-weighted MR images can be reconstructed, e.g., by the use of iterative SENSE, CS and/or contrast weighting in the oversampled k-space center (Song H K et. al, Magnetic Resonance in Medicine, vol. 44, no. 6, p. 825-832, 2000). The reconstruction of the individual contrasts is used according to the invention to estimate the contrast decay ($T_2$) and to derive a contrast map ($T_2$ map). A $T_2$ map can be obtained, for example, by pixel-wise determination of the signal decay in the differently $T_2$-weighted MR images. The TSE PROPELLER data are then de-blurred using the estimated relaxation decay. Pure PD- and $T_2$-weighted MR images are produced from the single PROPELLER acquisition. Also mixed contrasts ($T_1$, $T_2$, PD) based on user preference can be synthesized, and also quantitative relaxation time maps can be derived.

The concept of the invention can be extended to different sequence types and contrast variations. As another example, the invention may be applied to PROPELLER balanced TFE acquisitions in combination with contrast variation after a single inversion pulse providing the possibility of generating a $T_1$ map and different $T_1$ contrasts.

Figure 3:
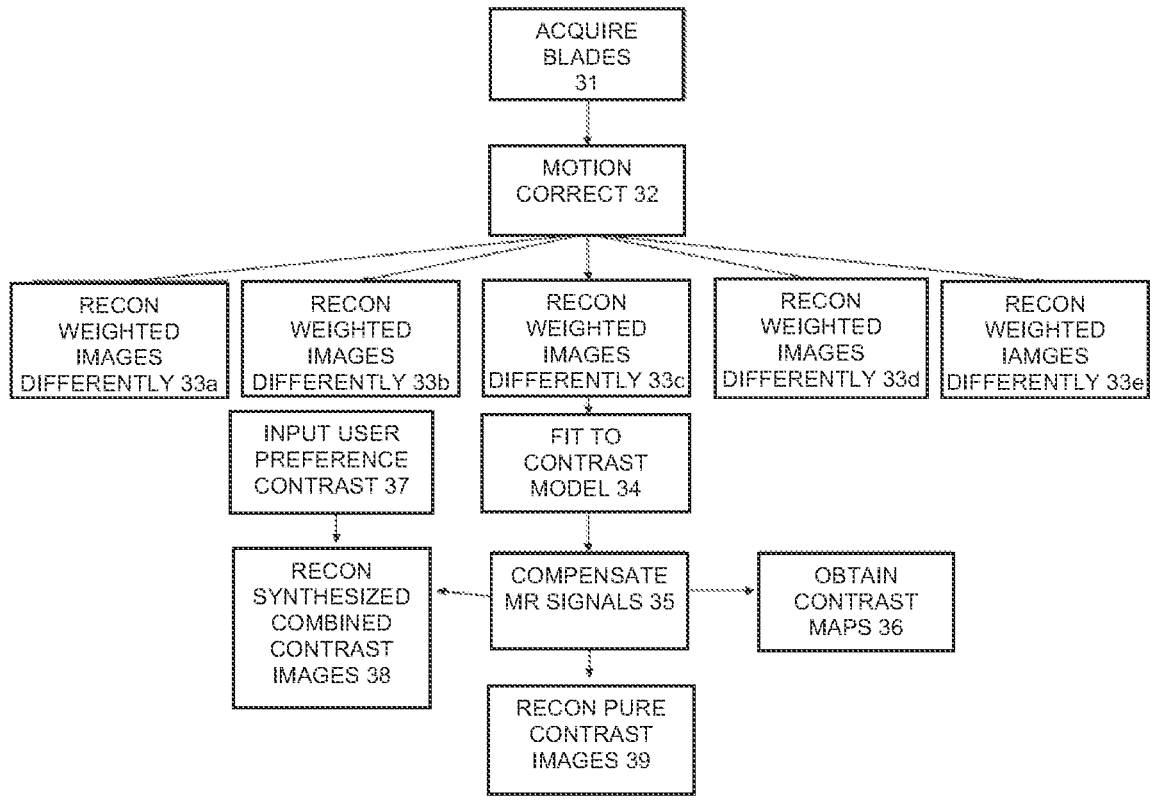
FIG. 3 illustrates the procedure of the invention as a block diagram.

FIG. 3 schematically illustrates the method of the invention. After the acquisition of the k-space blades with the different relaxation time in step 31, motion is estimated and corrected for in step 32 using appropriate similarity measures. Then individual MR images 33a-e with correspondingly different contrasts are reconstructed and the obtained contrast weightings are fitted to a contrast model in step 34 to estimate the relaxation weighting of the acquired MR signals. The acquired MR signals are then compensated according to the contrast model in step 35. Pure contrast MR images (e.g. a $T_1$-weighted MR image, a $T_2$-weighted MR image, a proton density-weighted MR image) can then be reconstructed from the compensated MR signal data in step 39. Contrast maps (e.g. a $T_1$ map, a $T_2$ map, a fat map, a water map) are obtained additionally in step 36 as a result of the fitting procedure. A user preference regarding the desired contrast can be entered in step 37. On this basis, MR images with a correspondingly synthesized combined contrast can be reconstructed from the MR signals in step 38.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof

The invention claimed is:

1. A method of magnetic resonance (MR) imaging of a body of a patient placed in an examination volume of a MR device, the method comprising:
   generating MR signals by subjecting at least a portion of the body to a MR imaging sequence comprising a number of RF pulses and switched magnetic field gradients;
   acquiring the MR signals as a plurality of k-space blades in temporal succession according to a PROPELLER scheme, each k-space blade comprising a number of substantially parallel k-space lines, wherein the k-space blades are rotated about the center of k-space, so that the total acquired data set of MR signals spans at least part of a circle in k-space, wherein a common central circular region of k-space is covered by all k-space blades, wherein a relaxation weighting of the MR signals varies between different k-space blades and k-space lines of a particular relaxation weighting are distributed irregulary in k-space;

estimating the relaxation weighting of the MR signals;

compensating the acquired MR signals according to the estimated relaxation weighting; and reconstructing a MR image from the compensated MR signals.

2. The method of claim 1, wherein the individual k-space lines are $T_1$-weighted and/or the $T_2$-weighted which weighting varies between the different k-space blades.

3. The method of claim 1, wherein a $T_1$-map and/or a $T_2$-map and/or a $B_0$ map and/or a water map and/or a fat map are derived from the acquired MR-signals, wherein the acquired MR signals are compensated for variations according to the derived $T_1$-map, $T_2$-map, $B_0$-map, water map and/or fat map.

4. The method of claim 1, wherein the relaxation weighting of the MR signals is varied by variation of echo times of the imaging sequence and/or by varying a time delay after a preparation pre-pulse.

5. The method of claim 1, wherein the imaging sequence is a multi-echo imaging sequence, including a turbo spin echo (TSE) sequence or a turbo field echo (TFE) or an echo planar imaging (EPI) sequence for generating a train of echo signals by each shot, wherein each k-space line of each k-space blade represents an echo signal.

6. The method of claim 5, wherein the relaxation weighting of the MR signals is varied by variation of an acquisition order of the k-space lines between the k-space blades.

7. The method of claim 5, wherein the relaxation weighting of the MR signals is varied by variation of echo shifting of the echo signals between the k-space blades.

8. The method of claim 1, wherein a relaxation weighted and/or a spectrally weighting MR image is reconstructed from the acquired MR signals for each individual relaxation weighting.

9. The method of claim 8, wherein a relaxation time map is derived from the reconstructed relaxation weighted MR images.

10. The method of claim 8, wherein the relaxation weighted MR images are reconstructed using compressed sensing or a parallel image reconstruction algorithm.

11. The method of claim 1 wherein a $T_1$-weighted MR image, a $T_2$-weighted MR image, a proton density-weighted MR image, a water MR image and/or a fat MR image are reconstructed from the compensated MR signals.

12. The method of claim 1, wherein the MR image has a combined $T_1$-weighted, $T_2$-weighted, proton density-weighted, water and/or fat contrast synthesized from the compensated MR signals.

13. The method of claim 1, wherein the MR imaging sequence includes a flip angle sweep of the RF pulses, wherein the flip angle attributed to each acquired MR signal is considered in the estimation of the relaxation weighting.

14. A magnetic resonance (MR) device comprising:

at least one main magnet coil for generating a uniform, steady magnetic field $B_0$ within an examination volume;

a plurality of gradient coils for generating switched magnetic field gradients in different spatial directions within the examination volume;

at least one RF coil for generating RF pulses within the examination volume and/or for receiving MR signals from a body of a patient positioned in the examination volume;

one or more computer processors configured for controlling the plurality of gradient coils and the at least one RF coil and for performing the following steps:

generating MR signals by subjecting at least a portion of the body to a MR imaging sequence including a plurality of RF pulses and switched magnetic field gradients;

acquiring the MR signals as a plurality of k-space blades in temporal succession according to a PROPELLER scheme, each k-space blade including a plurality of substantially parallel k-space lines, wherein the k-space blades are rotated about the center of k-space, so that a total acquired data set of MR signals spans at least part of a circle in k-space, wherein a common central circular region of k-space is covered by all k-space blades, wherein a relaxation weighting of the MR signals varies between different k-space blades and k-space lines of a particular relaxation weighting are distributed irregularly in k-space;

estimating the relaxation weighting of the MR signals;

compensating the acquired MR signals according to the estimated relaxation weighting; and reconstructing a MR image from the compensated MR signals.

15. A non-transitory computer-readable medium configured to control one or more processors to control a MR device to:

generate MR signals by performing a MR imaging sequence comprising a number of RF pulses and switched magnetic field gradients;

acquire the MR signals as a plurality of k-space blades in temporal succession according to a PROPELLER scheme, each k-space blade comprising a number of substantially parallel k-space lines, wherein the k-space blades are rotated about the center of k-space, so that the total acquired data set of MR signals spans at least part of a circle in k-space, wherein a common central circular region of k-space is covered by all k-space blades, wherein a relaxation weighting of the MR signals varies between different k-space blades and k-space lines of a particular relaxation weighting are distributed irregularly in k-space;

estimate the relaxation weighting of the MR signals;

compensate the acquired MR signals according to the estimated relaxation weighting; and reconstruct a MR image from the compensated MR signals.

* * * * *